(12) United States Patent
Rajagopal et al.

(10) Patent No.: US 7,196,564 B2
(45) Date of Patent: Mar. 27, 2007

(54) HIGH FREQUENCY BALANCED PHASE INTERPOLATOR

(75) Inventors: Narasimhan Trichy Rajagopal, Dallas, TX (US); Bradley A. Kramer, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/187,412

(22) Filed: Jul. 22, 2005

(65) Prior Publication Data
US 2007/0018707 A1    Jan. 25, 2007

(51) Int. Cl.
*H03K 3/00* (2006.01)

(52) U.S. Cl. ............... 327/246; 327/247; 327/269

(58) Field of Classification Search ............... 327/246, 327/247, 253, 258, 259, 269, 270
See application file for complete search history.

(56) References Cited

U.S. PATENT DOCUMENTS

| | | | | |
|---|---|---|---|---|
| 5,079,520 A | * | 1/1992 | Rapeli | 331/1 A |
| 5,554,945 A | * | 9/1996 | Lee et al. | 327/105 |
| 6,107,848 A | * | 8/2000 | Pickering et al. | 327/146 |
| 6,111,445 A | | 8/2000 | Zerbe et al. | |
| 6,121,808 A | * | 9/2000 | Gaudet | 327/231 |
| 6,204,733 B1 | * | 3/2001 | Cai | 331/108 B |
| 6,329,859 B1 | * | 12/2001 | Wu | 327/291 |
| 6,340,909 B1 | | 1/2002 | Zerbe et al. | |
| 6,369,661 B1 | * | 4/2002 | Scott et al. | 331/45 |
| 6,380,783 B1 | * | 4/2002 | Chao et al. | 327/258 |
| 6,384,653 B1 | * | 5/2002 | Broome | 327/247 |
| 6,466,098 B2 | * | 10/2002 | Pickering | 331/25 |
| 6,597,212 B1 | * | 7/2003 | Wang et al. | 327/117 |
| 6,791,388 B2 | * | 9/2004 | Buchwald et al. | 327/248 |
| 6,943,606 B2 | * | 9/2005 | Dunning et al. | 327/231 |

OTHER PUBLICATIONS

Patrik Larsson: "*A 2-166-MHz CMOS Clock Recovery PLL with Low-Vdd Capability*", IEEE Journal of Solid-State Circuits, vol. 34, No. 12, Dec. 1999, pp. 1951-1960.

* cited by examiner

*Primary Examiner*—Kenneth B. Wells
(74) *Attorney, Agent, or Firm*—William B Kempler; W. James Brady; Frederick J. Telecky, Jr.

(57) ABSTRACT

A phase interpolation system includes an input stage that provides first and second modulated input signals having selected first and second relative phase angles. A weighting system is configured to steer a first portion of the first modulated input signal to an output and a second portion of the first modulated input signal to an internal balancing node. The weighting system also is configured to steer a first portion of the second modulated input signal to the output and a second portion of the second modulated input signal to the balancing node. The first portion of the first and second modulated input signals are summed at the output to provide an interpolated output signal having a phase angle that is between the first and second phase angles.

12 Claims, 5 Drawing Sheets

HIGH FREQUENCY BALANCED PHASE INTERPOLATOR

TECHNICAL FIELD

This invention relates generally to electrical circuits and, more specifically, to system for implementing phase interpolation.

BACKGROUND

A phase interpolator is a commonly used block in communications as well as other types of circuits. For example, linear phase interpolators are often employed in phase-locked loop (PLL) and delay locked loop (DLL) circuits to allow the phase of sampling clocks to be adjusted in very fine increments. Various techniques have been developed in an effort to achieve linear phase interpolation. One type of interpolator employs a plurality of stages, each stage adjusting the phase of an output signal to a phase angle that is an average of two or more input signals.

Another type of phase interpolator can adjust a phase of its output to an incremental phase angle that is between two or more input signals. Various circuitry has been proposed to achieve the incremental adjustments for the output phase angle. In one example, the circuitry can be implemented using CMOS technology. Due to a square law relation that exists between current and the transconductance of MOS transistors, however, a linear variation in current may not translate to linear variation of gain in VGA stages designed using CMOS technologies. This non-uniform translation complicates implementing phase interpolators with linear interpolation steps, and therefore often requires the use of complex blocks, such as a current pre-distorter, to linearize the transconductance with current. Additional non-linearities can arise due to the effects of Miller capacitance in the transconductance stage, which can cause significant stray or phantom currents. The phantom currents in the stage thus are summed at the output and, thereby, result in increased non-linear behavior in the output signal.

As industry trends keep moving to higher density technology, nodes with smaller geometries and lower supply voltage it becomes increasingly difficult to implement conventional circuit techniques to provide for linear phase interpolation.

SUMMARY

The present invention relates generally to an approach to implement phase interpolation. One aspect of the present invention provides a phase interpolation system that includes an input stage that provides first and second modulated input signals having selected first and second relative phase angles. A weighting system is configured to steer a first portion of the first modulated input signal to an output and a second portion of the first modulated input signal to an internal balancing node. The weighting system also is configured to steer a first portion of the second modulated input signal to the output and a second portion of the second modulated input signal to the balancing node. The first portion of the first and second modulated input signals are summed at the output to provide an interpolated output signal having a phase angle that is between the first and second phase angles.

For example, the steering is implemented by varying a number of current carrying devices in different weighting stages of the weighting system so as to conduct the respective portions of the first and second modulated input signals to the output and to the balancing node. While the number of current carrying devices in each weighting stage can vary, the aggregate number of devices that carry current in the weighting system can remain substantially constant. This can be accomplished by using the same total number of current carrying devices and changing the number of devices that carry the current to the output summing node. The rest of the devices (e.g., those that do not carry current to the output summing node) dump the current into the balancing node and to the supply. The system thus affords improved linearity over previous architectures.

Another aspect of the present invention relates to a phase interpolation system that includes an input transconductance stage that converts first and second input voltage signals to corresponding first and second modulated current signals having substantially fixed DC current and $g_m$ but having different respective input phase angles. A first weighting network is configured to selectively weight the first modulated current signal, based on a control signal, by steering a first portion of the first modulated current signal through a first signal path to an output and by steering a second portion of the first modulated current through a second signal path to a balancing node. A second weighting network is configured to selectively weight the second modulated current signal, based on the control signal, by steering a first portion of the second modulated current signal through a third signal path to the output and by steering a second portion of the second modulated current through a fourth signal path to the balancing node. The first portion of the first and second modulated current signals is summed at the output to provide an interpolated signal having a corresponding phase angle, and the second portion of the first and second modulated current signals is aggregated at the balancing node.

DETAILED DESCRIPTION

Figure 1:
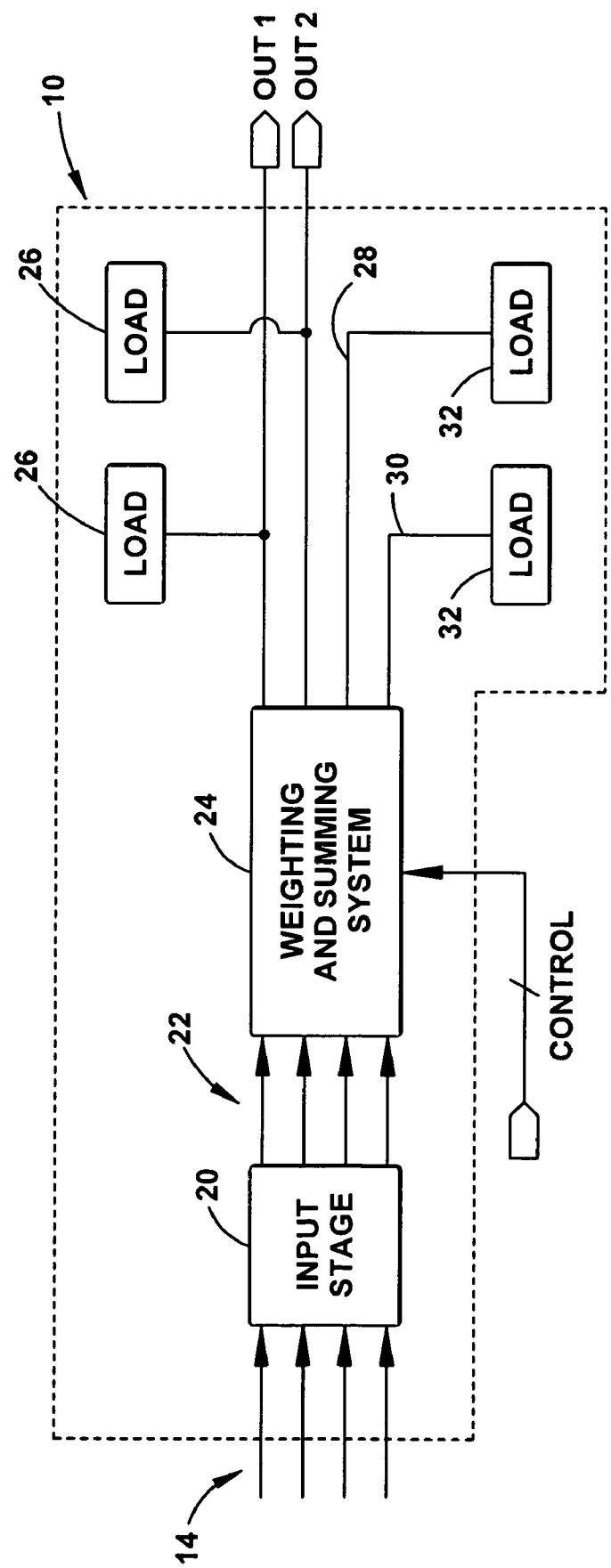
FIG. 1 depicts an example of an interpolator that can be implemented in accordance with an aspect of the present invention.

FIG. 1 depicts an example of an interpolator 10 that can be implemented according to an aspect of the present invention. The interpolator 10 includes an input stage 12 that receives selected input signals 14. For example, the input signals 14 can correspond to first and second phase signals having phase angles with a known phase angle difference. Additionally, for a differential architecture, the input signals can further include phase complements of the first and second phase signals. As used herein the phrase "phase complement" in both singular and plural forms corresponds to an out of phase signal (e.g., having its phase angles shifted 180° relative to the other signal(s)). The interpolator 10 interpolates between the first and second phase signals to provide a corresponding interpolated output signal having a phase angle that is between the phase angles of the input phase signals. For a differential architecture, an interpolated output signal can also be provided for the phase complements of the first and second phase signals. While FIG. 1 and much of the following description relates to a differential architecture, it will be understood that the approach is not limited to differential phase interpolation.

Figure 2:
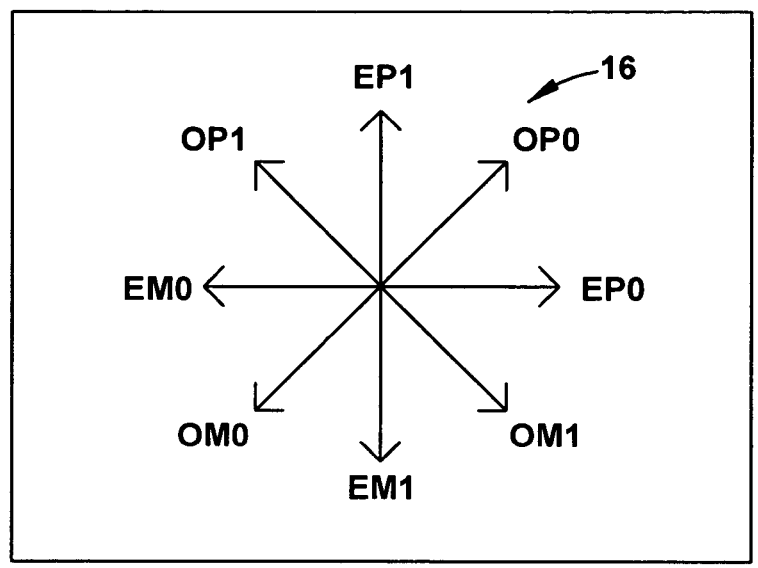
FIG. 2 depicts an example of phase shifted signals that can be input to an interpolation system implemented in accordance with an aspect of the present invention.

FIG. 2 depicts an example of phase vectors 16 that can be generated by a voltage controlled oscillator ((VCO) not shown in FIG. 1). The phase vectors 16 correspond to clock signals having a substantially uniform pulse width (e.g., about 50% duty cycle) and substantially constant frequency, but are out of phase relative to each other by a substantially fixed phase angle. In the example of FIG. 2, the phase vectors are identified as EP0, OP0, EP1, OP1, EM0, OM0, EM1 and OM1, respectively. Referring between FIG. 2 and FIG. 1, a phase decoder or other similar circuitry can select the input signals 14 from the available set of phase vectors 16, such as corresponding two adjacent vectors that are separated by a known phase angle (e.g., about 45 degrees). For the example of a differential architecture, if the signal EP0 is selected as one of the inputs, its complementary input EM0 will also be selected. The selected input signals 14 will also include either the vectors OP0 and OM0 or the vectors OP1 and OM1, assuming the vectors are chosen to be shifted 45 degrees in phase.

In FIG. 1, the interpolator 10 thus can vary the phase of an input signal by interpolating between the selected input signals 14. For example, the phase of the output signal(s) can be varied from 0 to 360 degrees with a discrete number of interpolation steps. The number of interpolation steps can vary according to the number of devices employed to implement weighting, as described herein. The input signals 14 can be selected by a phase decoder from the available phase vectors 16 (FIG. 2).

An input stage 20 of the interpolator 10 receives the selected input signals 14. The input signals 14 can correspond to voltage signals having substantially constant frequency and duty cycle, but are out of phase from each other by a predetermined amount, as mentioned above with respect to FIG. 2. The input stage 20 converts the input voltage signals to corresponding modulated current signals 22. For example, the input stage 20 can be implemented as an arrangement of one or more transconductance stages, such as differential transconductance stages or single ended transconductance stages, depending on the available headroom. The input stage 20 can provide each of the modulated current signals 22 with substantially equal magnitudes.

The modulated current signals 22 are provided to a weighting and summing system 24. The weighting and summing system 24 selectively weights each of the modulated current signals 22 (e.g., first and second phase vectors and their phase compliments). The weighting results in steering selected portions of the current signals 22 though circuit paths to one or more outputs, indicated at OUT1 and OUT2. For example, different weighting can be selectively implemented on the current signals 22 by varying the number of devices in the weighting and summing system that conduct current to the one or more outputs OUT1 and OUT2 according to a CONTROL signal. The CONTROL signal corresponds to an interpolator setting that defines the number of interpolation steps relative to the selected input signals 14. For instance, the CONTROL signal can be provided as a multi-bit digital control signal, such as a thermometer code, although other types of coding can also be implemented.

The weighting and summing system 24 also sums associated weighted modulated current signals to provide one or more corresponding interpolated output signals. For example, in a differential system, a first set of weighted modulated current signals can be summed to provide a first output signal, indicated at OUT1, and a second set of weighted modulated current signals can be summed to provide a second output signal, indicated at OUT2. The output signals are generated at OUT1 and OUT2 by providing the aggregate modulated current signals to respective loads 26. For instance, the loads 26 can correspond to resistive loads, which can be implemented as an arrangement of transistors or other circuit components (e.g., current source in parallel with a diode).

The weighting and summing system 24 can also perform complementary weighting relative to the modulated current signals 22 according to the CONTROL signal. The complementary weighting is implemented to maintain a substantially constant and balanced operating condition of the weighting and summing system 24. The substantially constant and balanced operating condition, for instance, corresponds to a substantially constant AC impedance associated with the weighting and summing system 24. Continuing with the example of a differential system, for example, a third set of weighted modulated current signals can be aggregated to provide a first balancing signal, indicated at 28, and a second set of weighted modulated current signals can be aggregated to provide a second balancing signal, indicated at 30. The balancing signals at 28 and 30 are generated by providing the aggregated modulated current signals to respective loads (e.g., balancing loads) 32. Additional circuitry can be associated with the loads 32 to mitigate parasitic effects and improve balancing between the dummy circuitry and the signal carrying circuitry, such as by simulating the capacitance at the outputs OUT1 and OUT2.

From the foregoing description of FIG. 1, it will be appreciated that linearity in the interpolation can be improved over previous architectures. The improved linearity can be achieved because the parasitic effects and process variations remain substantially constant during operation regardless of the amount of interpolation being implemented relative to the input signals 14. For instance, because the same number and type of devices are active for all settings of the CONTROL signal, Miller capacitance and other parasitic effects remain substantially constant and balanced between the active circuitry that cooperates to provide the output signals at OUT1 and OUT1 and the active circuitry that cooperates to provide the balancing signals at 28 and 30. Additionally, the input stage 20 of the interpolator 10 can be adapted to be used with low voltage designs, which allows usage of balancing (or dummy) circuitry even when less the head room is available for operation.

Figure 3:
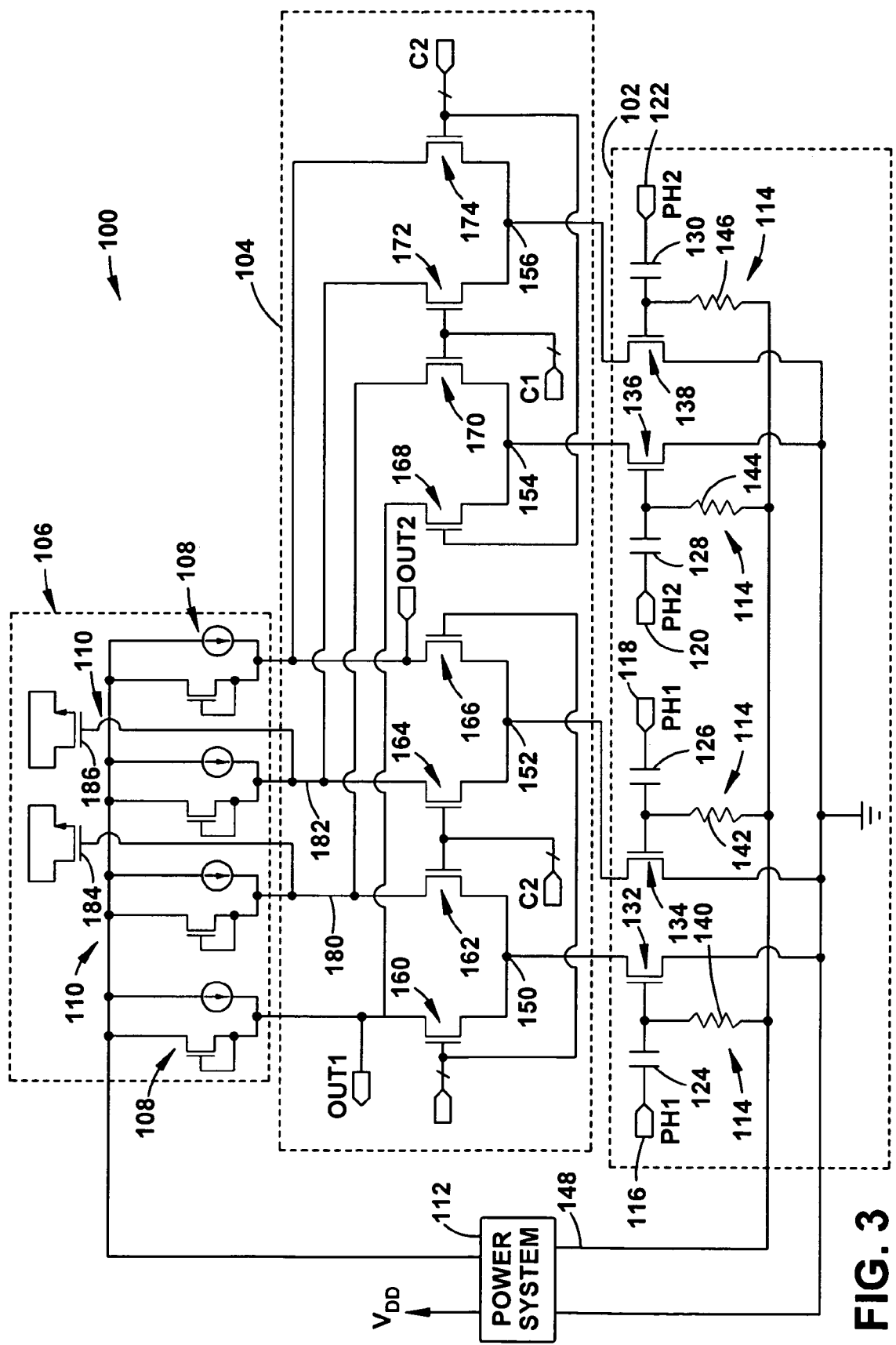
FIG. 3 depicts an example is a circuit diagram depicting an interpolator in accordance with an aspect of the present invention.

FIG. 3 depicts an example of an interpolator circuit 100 that can be implemented according to an aspect of the present invention. The interpolator 100 includes an input stage 102 configured to convert selected phase modulated input signals PH1, $\overline{PH1}$, PH2 and $\overline{PH2}$ into corresponding modulated current signals. For example, PH1 (PH2) can be provided as modulated voltage signals with the same frequency and duty cycle as $\overline{PH1}$ ($\overline{PH2}$), but phase shifted 180 degrees. The modulated input signals can be generated, for example, by a multi-stage VCO and selected (e.g., by phase detection circuitry, not shown) according to a desired output phase. The magnitude of the modulated current signals remains substantially constant since the duty cycle of the modulated voltage signals also remains substantially constant.

A weighting and summing system 104 weights and sums the modulated current signals according to interpolator control settings, indicated at C1 and C2. For example, each of C1 and C2 corresponds to a multi-bit setting in which each bit defines a state of an associated device or component in the weighting and summing system 104. The weighting and summing of modulated current signals, for example, occurs according to which current carrying devices are activated to conduct current in respective signal paths, which current varies according to the respective control settings C1 and C2. While the current in each signal path through the weighting and summing system 104 can vary as a function of C1 and C2, the aggregate DC current through the weighting and summing system remains substantially constant and equal to the constant DC current supplied by the input stage 102. It will be appreciated that the total number of devices that are turned on by C1 and C2 remains a constant even when the number of devices turned on by C1 or C2 by themselves can change based on interpolator code. This results in the AC impedance of the weighting circuit remaining substantially constant.

An output stage 106 is driven by the respective weighted signals to provide corresponding interpolated output signals at OUT1 and OUT2. For example, the control settings C1 and C2 define the amount of current that is steered through signal paths to output loads 108 associated with each of the outputs OUT1 and OUT2. The control settings also define a complementary current that is steered through balancing paths to balancing (or "dummy") loads 110, which current can be returned to a corresponding power system 112. The system 100 is configured so that the current steered to the load outputs 108 cooperates with the current steered to the balancing loads 110 to mitigate parasitic effects and process variations. The result is more accurate interpolation steps, as described herein.

As an example, each of the output loads 108 is depicted as including a current source in parallel with a diode-connected transistor that is coupled between a respective output OUT1 and OUT2 and a regulated voltage rail provided by the power system 112 The dummy loads 110 are also depicted as including current sources in parallel with a diode-connected transistors between dummy outputs 180 and 182 and the regulated voltage rail. It will be understood and appreciated that other types of (e.g., resistive) loads could also be utilized.

Turning to the content of the input stage 102, the input stage 102 includes single-ended transconductance stages 114. Each of the transconductance stages 114 receives a respective one of the phase input signals PH1, $\overline{PH1}$ PH2 and $\overline{PH2}$ at a corresponding input 116, 118, 120, and 122. The transconductance stages 114 are AC-coupled to the inputs 116, 118, 120, and 122 through capacitors 124, 126, 128 and 130. In the example of FIG. 3, the capacitors 124, 126, 128 and 130 are connected between the inputs 116, 118, 120, and 122 and gates of transistor (e.g., n-channel metal oxide field effect transistors (NMOS)) devices 132, 134, 136 and 138. The transistor devices 132, 134, 136 and 138 are connected between the weighting and summing system 104 and electrical ground for providing modulated AC current to the weighting and summing system based on the phase input signals PH1, $\overline{PH1}$, PH2 and $\overline{PH2}$.

Each of the transconductance stages 114 also includes resistors 140, 142, 144 and 146 connected to a substantially fixed DC voltage rail 148 to provide a corresponding DC bias to each of the transconductance stages 114. The DC voltage on the rail 148 is provided by the power system 112. The input cut-off frequency of the transconductance stages 114 is determined by the R-C effect of the coupling capacitors 124–130 and the bias resistors 140–146, which can be configured according to the application in which the interpolator 100 is to be used. The transconductance stages 114 provide corresponding AC modulated current as corresponding input signals to respective inputs 150, 152, 154 and 156 of the weighting and summing system 104. Since the DC current for each of the transconductance stages 114 remains substantially fixed, the transconductance of the input stage also remains substantially fixed. In the example of FIG. 3, two single ended transconductance stages 114 are used due to head room constrained by a low supply voltage. It will be understood and appreciated that a differential input stage may be preferable in other cases, such as where better common mode rejection is desired.

The weighting and summing system 104 includes complementary weighting stages 160, 162, 164, 166, 168, 170, 172 and 174 connected at each of the inputs 150, 152, 154 and 156. Each weighting stage includes a controllable signal path, represented schematically as transistor devices. Each pair of weighting stages 160 and 162; 164 and 166; 168 and 170; 172 and 174 defines a weighting network that is associated with a given input 150, 152, 154 and 156, respectively. In the example of FIG. 3, there is one weighting network for each transconductance stage 114. Each weighting stage 160, 162, 164, 166, 168, 170, 172 and 174 in each weighting network implements a weighting function relative to the AC modulated current signals by adjusting the number of devices in the signal path that are activated to carry current based on the interpolator settings C1 and C2. The number of devices that carry current in each weighting stage results in the AC modulated current being steered to either an associated output, OUT1 or OUT2, or to a balancing node 180 or 182.

Figure 4:
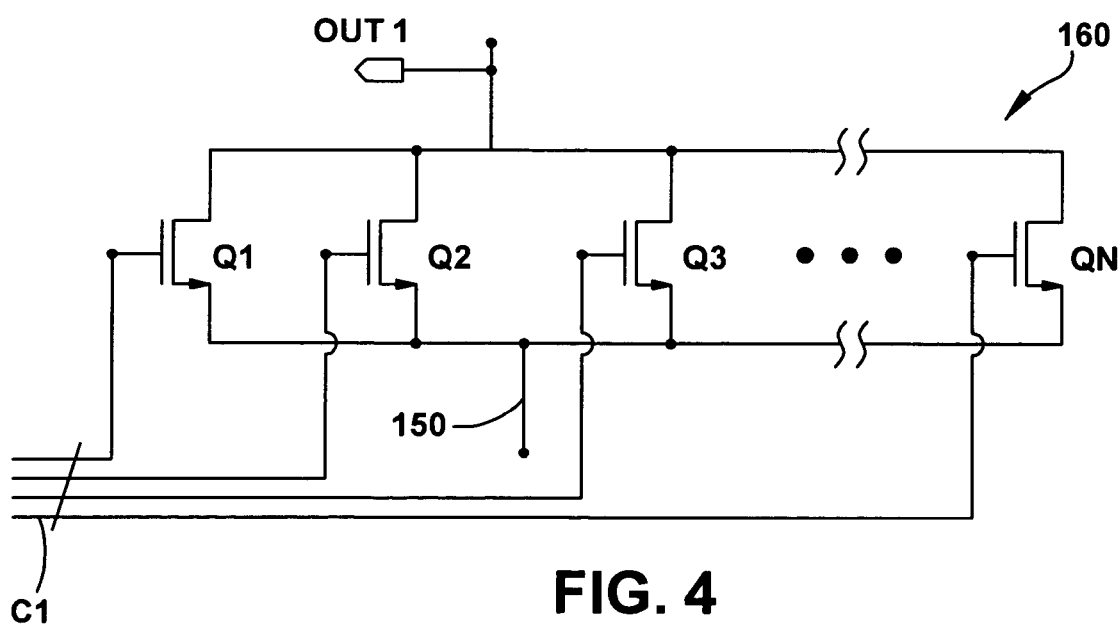
FIG. 4 depicts an example of a cascode stage that can be utilized in an interpolator in accordance with an aspect of the present invention.

FIG. 4 depicts an example of a weighting stage 160 that can be implemented to performing weighting of the AC modulated current from the input stage 102. The weighting stage 160 thus includes a plurality of transistors (e.g., NMOS devices) Q1, Q2, Q3 through QN connected in parallel between an input and output, respectively indicated at 150 and OUT1, where N is positive integer (N>1) denoting the number of transistors. The multi-bit digital interpolator setting C1 provides a control input (e.g., one bit of the multi-bit C1) to the gate of each respective transistor Q1–QN so as to control the number of current devices that carry current in the signal path between the input 150 and the output OUT1. The number of transistors in the weighting stage 160 thus defines the number of available interpolator settings between the respective phase input signals PH1 and PH2.

Assuming that the available phase input signals are provided as 8 vectors that are 45 degrees apart, then the weighting can be selectively applied to provide for N×8 interpolation steps. For instance, if N=16, the phase of the output signal at OUT1 can be varied from 0 to 360 degrees with 128 interpolation steps. If the transistors Q1–QN are formed as the same size and type of devices (e.g., NMOS devices having same channel length and width), then the interpolation steps will be substantially uniform commensurate with changes in C1 and C2, such that linear interpolation can be provided. Different size transistors can also be utilized to provide for different functional modes (e.g., quadratic) of interpolation. Each of the stages 160–174 can be implemented with the same number N of transistors for implementing weighting. Additionally or alternatively, the transistors in the stages 160–174 can be scaled to mitigate magnitude and phase error.

The amount of current (corresponding to the number of current carrying transistors) in each respective stage thus defines the weighting of the AC modulated signals and resulting in a corresponding amount of phase interpolation. Returning to FIG. 3, the output signal at OUT1 corresponds to the sum of outputs from stages 160 and 168. In particular, the interpolator setting C1 is applied as the control input to the stage 160 and the complementary interpolator setting C2 is applied as the control input to the stage 168. C2 is also applied as the control input of the signal path for stage 162, which is connected to a balancing node 180, and C1 is supplied as the control input to signal path stage 170, which is also connected to the balancing node 180. For example, if the interpolator setting C1 is set to activate M transistors to conduct current in the weighting stage 160, then the setting C2, being complementary relative to C1, is set to activate N−M transistors to conduct current in the weighting stage 168. This complimentary mode of operation ensures that a constant number (N) of current conducting transistors are active (e.g., carrying current) in each weighting network for all interpolator settings. By way of further example, the transistors in each weighting network can be operated in a complementary manner based on C1 and C2, such that a constant number of N transistor devices remain activated in each weighting network (a total of 4*N devices for the system 100) over a range of interpolator settings C1 and C1.

The interpolated output signal OUT1 thus corresponds to voltage across the load 108 that is connected at OUT1 due to the sum of the weighted AC modulated current through the weighting stage 160 and the weighted AC modulated current through the weighting stage 168. Similarly, the interpolated output signal OUT2 corresponds to voltage across the load 108 that is connected at OUT2 due to the sum of the weighted AC modulated current through the weighting stage 166 and the weighted AC modulated current through the weighting stage 174. For example, the interpolated output signals at OUT1 and at OUT2 can be 180 degrees out of phase relative to each other, corresponding to differential operation.

The other weighting stages 162, 164, 170 and 172 are utilized to drive the balancing loads 110 connected at respective nodes 180 and 182. For instance, the weighting stage 162 is operated based on C2 to route current from the node 150 to the node 180 through a subset of transistors complimentarily to the subset of transistors activated to conduct current through the weighting stage 160. Each of the other weighting stages 164, 170 and 172 is activated similarly by one of the interpolator settings C1 or C2. Each of the balancing loads 110 is driven with modulated current in a manner similar to the output loads 108. For example, the weighting stage 162 provides AC modulated current to the node 180 based on the interpolator setting C2 and the weighting stage 170 provides AC modulated current to the node 180 based on the complementary interpolator setting C1. Similarly, the weighting stage 164 provides AC modulated current to the node 180 based on the interpolator setting C2 and the weighting stage 172 provides AC modulated current to the node 180 based on the complementary interpolator setting C1.

The balancing loads 110 can be configured to return current to the supply associated with the power system 112. Additionally, other components 184 and 186 can be coupled to the nodes 180 and 182, respectively, to simulate the effect of circuitry connected to the outputs OUT1 and OUT2. For example, the components 184 and 186 can be configured to add capacitance (e.g., gate capacitance from appropriately configured transistors) at the nodes 180 and 182 to which the balancing loads 110 are connected.

It will be appreciated that, despite the variation of the interpolation settings C1 and C2, the total number of active transistors in the weighting and summing system 104 does not change since the number of transistors in weighting stages 162, 164, 170 and 172, which dump the AC current into the supply is switched in a complementary manner with respect to the signal current carrying transistors in weighting stages 160, 166, 168 and 174. This way the AC impedance looking into the weighting and summing system 104 remains substantially constant since the number of current conducting paths (e.g., corresponding to a transistor operating in an "ON" state) also remains a constant. Additionally, configuration and operation of the interpolator 100 greatly reduces the effect of the miller capacitance in the input stage 102, as the DC current and the load impedance of the transconductance input stages do not vary with change in the interpolator settings C1 and C2. The leakage that exists, however, does not affect the linearity of the interpolator steps, such that the overall results of such effects is improved linearity of the interpolator steps.

Figure 5:
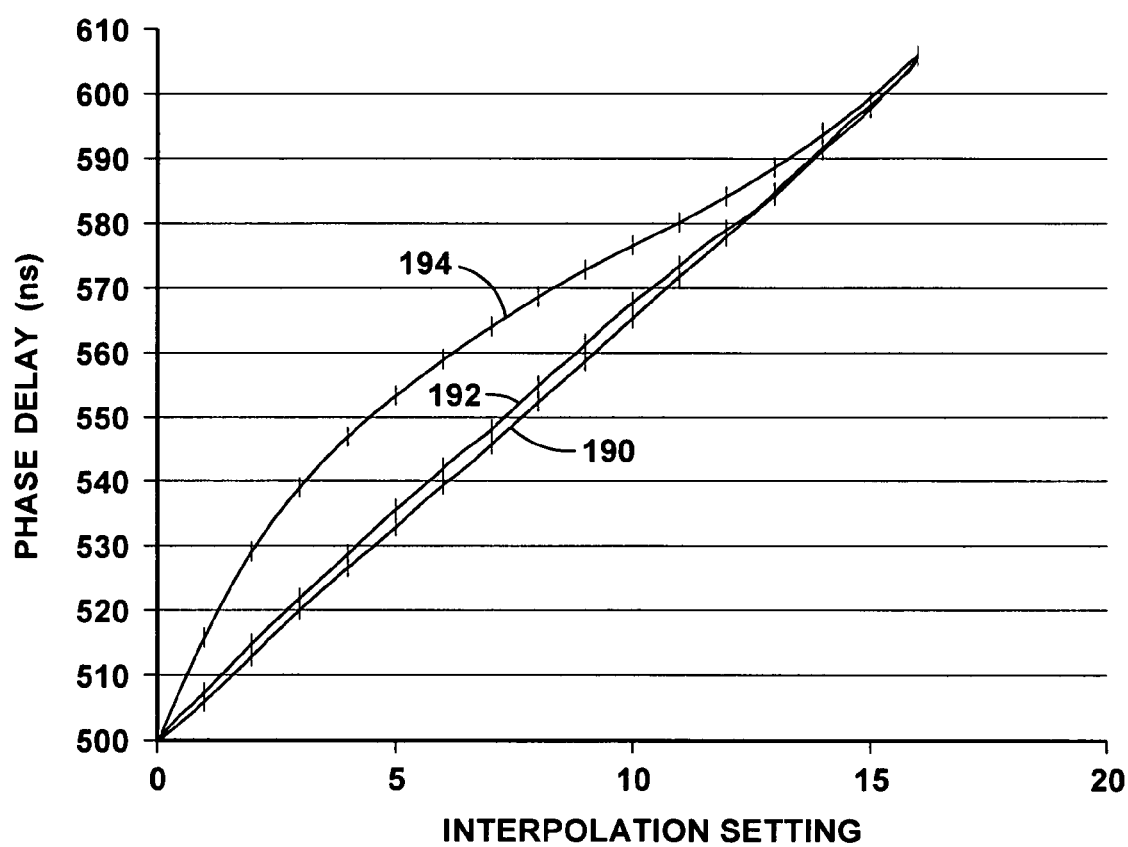
FIG. 5 is a graph depicting a comparison of phase interpolated signals.

FIG. 5 is a graph depicting a comparison of phase delay for interpolated output signals 190, 192 and 194 across 16 interpolator settings. The curve 190 corresponds to an ideal interpolation exhibiting perfect linear behavior. The curve 192 corresponds to an interpolator output signal achieved by performing interpolation according to an aspect of the present invention (e.g., by the interpolator 100 or 10). The curve 194 corresponds to an interpolator output signal generated by a conventional interpolator architecture that scales the DC current in the transconductance stage to accomplish the weighting operation. Significantly, the curve 192 generated to simulate the worst case linearity for the interpolator, which still results in improved linearity than the nominal case in the conventional architecture.

Figure 6:
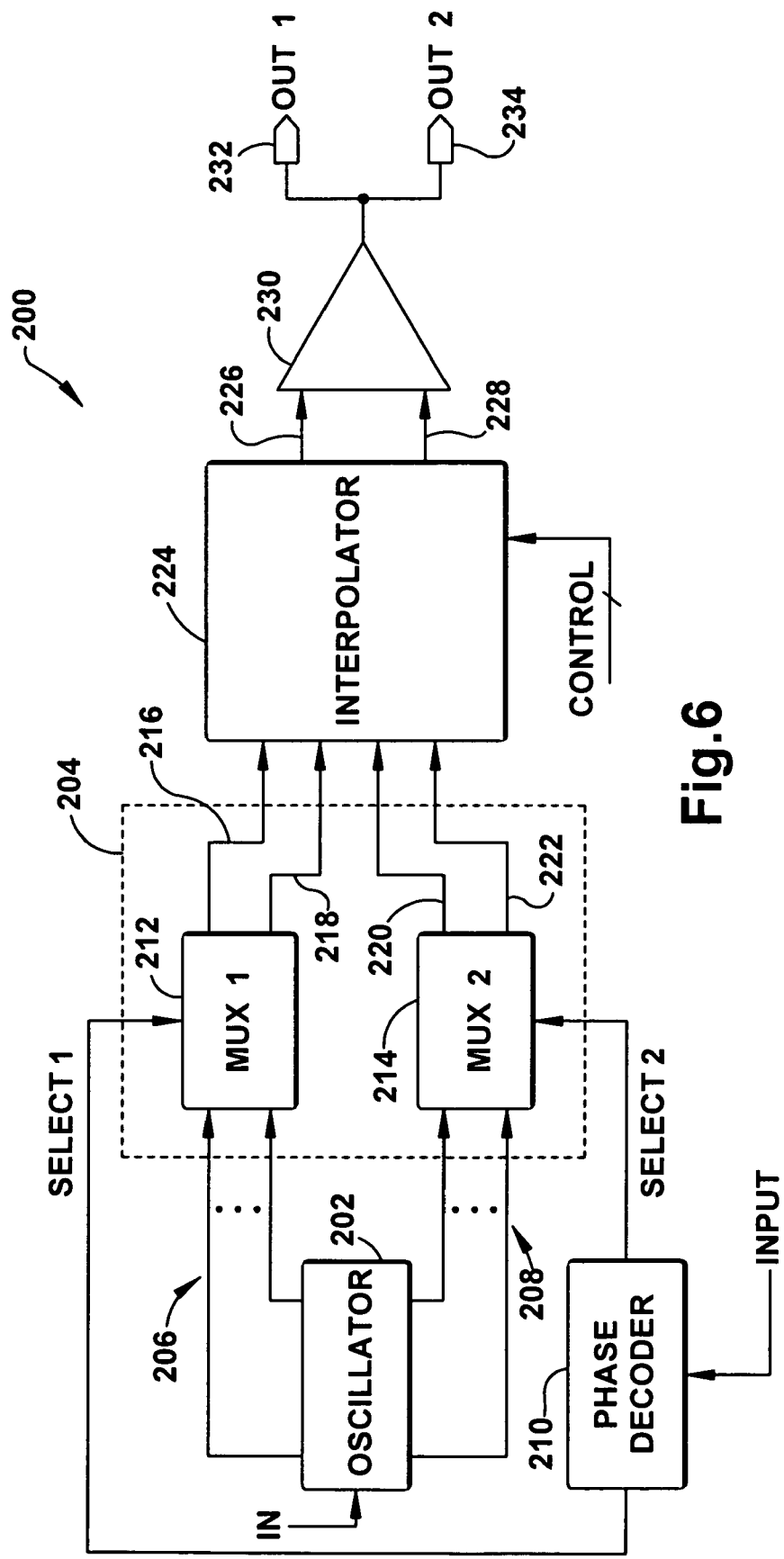
FIG. 6 depicts an example of an interpolation system that can be implemented in accordance with an aspect of the present invention.

FIG. 6 depicts an example of an interpolator system 200 that can be implemented in accordance with an aspect of the present invention. The interpolator system 200 includes an oscillator 202 that provides a plurality of phase shifted output signals to a selection system 204. For example, the oscillator 202 can be implemented as multi-stage VCO that provides 8 clock phases that are 45 degrees apart, ranging from 0 degrees to 360 degrees, such as shown in FIG. 2. A first set of the output signals 206 can each be 90 degrees apart, such as provided at 0 degrees 90 degrees, 180 degrees and 270 degrees. A second set of the output signals 208 can also be 90 degrees apart, but shift 45 degrees relative to the output signals in the first set 206.

The selection system 204 selects one or more signals from the first set of output signals 206 and one or more signals form the second set of output signals 208. For example, a phase decoder (or other circuitry) 210 provides selection signals to control which two signals (or input vectors) are selected from the oscillator 202. For example, the phase decoder provides selection signals (SELECT1 AND SELECT2) to the selection system to select two adjacent vectors, one from the first set of output signals 206 and one from the second set of output signals 208. It is the selected input signals that are to be interpolated.

In the example of FIG. 6, the selection system includes first and second multiplexers (MUX 1 and MUX 2) 212 and 214, respectively. The first multiplexer 212 selects a first phase vector of the two input vectors that are to be interpolated based on SELECT1. Since the interpolation system can be implemented as a differential system, the first multiplexer 212 also selects is the corresponding out of phase signal of the first vector that is chosen based on the SELECT1 signal (e.g., a multi-bit digital input signal). With reference to FIG. 2, for example, if the first multiplexer 212 selects the signal EP0 as a first output 216, the first multiplexer will select the other output 218 as EM0. The second multiplexer 214 then selects, as one output 220, a vector that is adjacent to the vector selected by the first multiplexer 212 based on the SELECT2 signal. In the differential architecture example depicted in FIG. 6, the second multiplexer 214 also selects the corresponding out of phase signal as another output 222, also based on the SELECT2 signal. Continuing with the above example, if the first multiplexer 212 selects EP0 and EM0, the second multiplexer 214 would select vectors OP0 and OM0 or OP1 and OM1 as the outputs 220 and 222, respectively, since the chosen vectors are to be 45 degrees in phase.

An interpolator 224 performs interpolation relative to the selected vectors provided at 216–222 according to an aspect of the present invention. As described herein (see, e.g., FIGS. 1 and 3), the phase interpolation is basically obtained by summing appropriately weighted input signals. The weighting can be done using a VGA stage, for example, by controlling the number of current paths that steer modulated current to corresponding outputs 226 and 228 of the interpolator. Equal weights can be implemented by providing equal numbers of current paths for each of the outputs and for each of the balancing paths, which for the example of input vectors that are 45 degrees apart, provides a 22.5 degree phase shift from the selected vectors. An output gain stage 230 can also be employed to amplify the interpolated output signals 226 and 228 to provide corresponding amplified outputs at 232 and 234.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A phase interpolation system, comprising:
  an input stage that provides first and second modulated input signals having selected first and second relative phase angles; and
  a weighting system configured to steer a first portion of the first modulated input signal to an output and a second portion of the first modulated input signal to an internal first node, the weighting system also being configured to steer a first portion of the second modulated input signal to the output and a second portion of the second modulated input signal to the first node, the first portion of the first and second modulated input signals being summed at the output to provide an interpolated output signal having a phase angle that is between the first and second phase angles;
  a first weighting network configured to selectively weight the first modulated input signal by steering the first portion of the first modulated input signal through a first weighting stage to the output based on a first control signal, and by steering the second portion of the first modulated input through a second weighting stage to the first node based on a second control signal;
  a second weighting network configured to selectively weight the second modulated input signal by steering the first portion of the second modulated input signal through a third weighting stage to the output based on the second control signal and by steering the second portion of the second modulated input through a fourth weighting stage to the first node based on the first control signal;
  wherein each of the first weighting stage and the second weighting stage further comprises a plurality of transistor devices that are selectively activated to conduct current corresponding to the first and second portions of the first modulated input signal therethrough based on the first control signal and the second control signal, respectively;
  wherein each of the third weighting stage and the fourth weighting stage further comprises a plurality of transistor devices that are selectively activated to conduct current corresponding to the first and second portions of the second modulated input signal therethrough based on the second control signal and the first control signal, respectively;
  wherein the first control signal comprises multi-bit control signal provided to activate M of the N transistor devices in each of the first weighting stage and the fourth weighting stage, where M is a positive integer less than or equal to N and N is a positive integer denoting the number of transistor devices; and
  wherein the second control signal comprises a multi-bit control signal provided to activate N minus M of the transistors devices in each of the second weighting stage and the third weighting stage in a complementary manner relative to the first weighting stage and the fourth weighting stage, such that a constant number of 2*N transistor devices remain activated over a range of interpolator settings defined by the first and second control signals.

2. The system of claim 1, wherein the first and second modulated input signals are respective first and second modulated current signals, the system further comprising an output stage that comprises:
  a first load coupled to the output, the first portion of the first and second modulated current signals being summed to provide the interpolated output signal; and
  a second load coupled to the first node, the second portion of the first and second modulated current signals being aggregated at the first node and substantially returned to an associated power system.

3. The system of claim 2, wherein the first and second modulated current signals provide substantially constant DC current.

4. The system of claim 1, wherein the weighting system further comprises:
  a first weighting stage coupled between the first modulated input signal and the output;
  a second weighting stage coupled between the first modulated input signal and the first node;
  a third weighting stage coupled between the second modulated input signal and the output, wherein each of the first and third weighting stages comprises an equal number of devices that are operated in a complementary manner based on first and second control signals, respectively, to provide the interpolated output signal at the output; and
  a fourth weighting stage coupled between the second modulated input signal and the first node wherein each of the second and fourth weighting stages comprises an equal number of devices that are operated in a complementary manner based on the first and second control signals, respectively.

5. The system of claim 4, wherein the number of devices operated to conduct current though each of the weighting stages determines weighting of first and second modulated signals, the weighting being applied so as to provide substantially uniform step changes in the phase angle of the interpolated output signal commensurate with changes in the first and second control signals.

6. A phase interpolation system, comprising:
an input stage that provides first and second modulated input signals having selected first and second relative phase angles; and
a weighting system configured to steer a first portion of the first modulated input signal to a first output and a second portion of the first modulated input signal to an internal first node, the weighting system also being configured to steer a first portion of the second modulated input signal to the output and a second portion of the second modulated input signal to the first node, the first portion of the first and second modulated input signals being summed at the output to provide an interpolated output signal having a phase angle that is between the first and second phase angles;
a selection system configured to select the first and second modulated input signals from a plurality of available phase vectors;
wherein the selection system is configured to select third and fourth modulated input signals corresponding to phase compliments of the first and second modulated input signals, respectively,
wherein the weighting system is further configured to steer a first portion of the third modulated input signal to a second output and a second portion of the third modulated input signal to a second node, the weighting system also being configured to steer a first portion of the fourth modulated input signal to the second output and a second portion of the fourth modulated input signal to the second node, the first portion of the third and fourth modulated input signals being summed at the second output to provide a second interpolated output signal that is a phase compliment of the interpolated output signal provided at the first output.

7. The system of claim 6, wherein the weighting system further comprises a plurality of weighting networks, each weighting network being configured to selectively weight a respective one of the first, second, third and fourth modulated input signals by controlling a plurality of transistors that conduct respective portions of the first, second, third and fourth modulated input signals to each of the first output, the second output, the first node and the second node, the number of transistors in the weighting system that conduct remaining substantially constant over a range of interpolator settings.

8. A differential phase interpolation system comprising:
an input transconductance stage that converts first and second modulated input voltage signals to corresponding first and second modulated current signals having substantially fixed DC current and different relative phase angles;
a first weighting network configured to selectively weight the first modulated current signal, based on a control signal, by steering a first portion of the first modulated current signal through a first signal path to an output and by steering a second portion of the first modulated current through a second signal path to a first node; and
a second weighting network configured to selectively weight the second modulated current signal, based on the control signal, by steering a first portion of the second modulated current signal through a third signal path to the output and by steering a second portion of the second modulated current through a fourth signal path to the first node,
the first portion of the first and second modulated current signals being summed at the output to provide an interpolated signal having a phase angle, the second portion of the first and second modulated current signals being aggregated at the first node;
wherein the output is a first output, the input transconductance stage converting third and fourth input voltage signals to corresponding third and fourth modulated current signals, which correspond to phase compliments of first and second modulated current signals, respectively, the differential system further comprising:
a third weighting network configured to selectively weight the third modulated current signal, based on a control signal, by steering a first portion of the third modulated current signal through a fifth signal path to a second output and by steering a second portion of the first modulated current through a sixth signal path to a second node; and
a fourth weighting network configured to selectively weight the fourth modulated current signal, based on the control signal, by steering a first portion of the fourth modulated current signal through a seventh signal path to the second output and by steering a second portion of the fourth modulated current through an eighth signal path to the second node,
the first portion of the third and fourth modulated current signals being summed at the second output to provide a second interpolated signal that is a phase complement of the interpolated signal at the first output, the second portion of the third and fourth modulated current signals being aggregated at the second node.

9. The system of claim 8, wherein the control signal further comprises a first control signal and a second control signal, the first and second control signals being complementary signals;
the first signal path comprises a first plurality of devices arranged substantially in parallel between a first input and the output, the input transconductance stage providing the first modulated current signal to the first input, the first plurality of devices being selectively activated and deactivated based on the first control to steer the first portion of the first modulated current signal to the output;
the second signal path comprises a second plurality of devices arranged substantially in parallel between the first input and the balancing node, the second plurality of devices being selectively activated and deactivated based on the second control to steer the first portion of the second modulated current signal to the first node;
the third signal path comprises a third plurality of devices arranged substantially in parallel between a second input and the output, the input transconductance stage providing the second modulated current signal to the second input, the third plurality of devices being selectively activated and deactivated based on the second control to steer the first portion of the first modulated current signal to the output;
the second signal path comprises a second plurality of devices arranged substantially in parallel between the second input and the first node, the second plurality of devices being selectively activated and deactivated based on the first control to steer the first portion of the second modulated current signal to the node.

10. The system of claim 9, wherein each of the first, second, third and fourth plurality of devices includes the same number of devices, the total number of devices in the weighting system that are activated to conduct current remaining substantially constant over a range of interpolator settings defined by the first and second control signals.

11. The system of claim 8, further comprising an output stage that comprises:
 a first load coupled to the output, such that the sum of the first portion of the first and second modulated current signals provides the interpolated output signal; and
 a second load coupled to the first node, the second portion of the first and second modulated current signals being summed at the first node for return to an associated power system.

12. The system of claim 8, further comprising a selection system configured to select the first and second modulated input voltage signals from a plurality of available phase vectors corresponding voltage signals having different phase angles.

* * * * *